(12) United States Patent
Takemura

(10) Patent No.: US 10,224,858 B2
(45) Date of Patent: Mar. 5, 2019

(54) SEMICONDUCTOR DEVICE AND SEMICONDUCTOR SYSTEM EQUIPPED WITH THE SAME

(71) Applicant: Renesas Electronics Corporation, Koutou-ku, Tokyo (JP)

(72) Inventor: Narihira Takemura, Tokyo (JP)

(73) Assignee: Renesas Electronics Corporation, Tokyo ( * ) Notice: Subject to any disclaimer, the term of this patent is extended or adjusted under 35 U.S.C. 154(b) by 0 days.

(21) Appl. No.: 15/597,092

(22) Filed: May 16, 2017

(65) Prior Publication Data

US 2018/0034404 A1 Feb. 1, 2018

(30) Foreign Application Priority Data

Jul. 28, 2016 (JP) .................. 2016-148043

(51) Int. Cl.
| | | |
|---|---|---|
| H02M 7/00 | (2006.01) | |
| H02P 27/06 | (2006.01) | |
| H02K 11/20 | (2016.01) | |
| G01R 31/00 | (2006.01) | |
| G01R 31/04 | (2006.01) | |
| H01L 23/495 | (2006.01) | |
| H01L 23/00 | (2006.01) | |
| H02M 1/084 | (2006.01) | |

(Continued)

(52) U.S. Cl.
CPC ............ *H02P 27/06* (2013.01); *G01R 31/005* (2013.01); *G01R 31/041* (2013.01); *H01L 23/4952* (2013.01); *H01L 23/562* (2013.01); *H02K 11/20* (2016.01); *H02M 1/084* (2013.01); *H02M 1/32* (2013.01); *H02M 7/003* (2013.01); *H02M 7/537* (2013.01); *H01L 2224/05554* (2013.01); *H01L 2224/48091* (2013.01); *H01L 2224/48247* (2013.01); *H01L 2224/49113* (2013.01)

(58) Field of Classification Search
CPC .................. G01R 31/048; G01R 31/31; G01R 31/31724; H02M 7/00; H02M 7/538; H02P 7/29
USPC .................................. 318/599, 811, 569, 600
See application file for complete search history.

(56) References Cited

U.S. PATENT DOCUMENTS

| 7,956,643 B2 * | 6/2011 | Fukuda | .................. H01L 23/50 326/52 |
|---|---|---|---|
| 2005/0270859 A1 * | 12/2005 | Kato | .................... G11C 29/025 365/189.05 |

(Continued)

FOREIGN PATENT DOCUMENTS

JP 2009-147142 A 7/2009

*Primary Examiner* — Rina Duda
(74) *Attorney, Agent, or Firm* — Shapiro, Gabor and Rosenberger, PLLC

(57) ABSTRACT

A semiconductor device includes a semiconductor chip, a lead frame and one bonding wire and the other bonding wire which couple together the semiconductor chip and the lead frame. The semiconductor chip includes one pad which is coupled to one bonding wire and to which an output signal which has been generated in the semiconductor chip is supplied, the other pad which is coupled to the other bonding wire and to which a feedback signal is supplied from the lead frame and a fault detection circuit which compares the output signal which is supplied to one pad with the feedback signal which is supplied to the other pad.

11 Claims, 14 Drawing Sheets

(51) Int. Cl.
*H02M 1/32* (2007.01)
*H02M 7/537* (2006.01)

(56) References Cited

U.S. PATENT DOCUMENTS

| | | | | |
|---|---|---|---|---|
| 2007/0114954 A1* | 5/2007 | Hampo | ............... | B60L 11/1868 318/105 |
| 2007/0234167 A1* | 10/2007 | Momii | ............. | G01R 31/31724 714/742 |
| 2011/0140730 A1* | 6/2011 | Zieren | .................. | G01R 31/048 324/762.03 |
| 2011/0241933 A1* | 10/2011 | Nishiyama | ............... | G01S 7/064 342/179 |
| 2013/0147409 A1* | 6/2013 | Song | ........................ | H02P 7/29 318/400.26 |

* cited by examiner

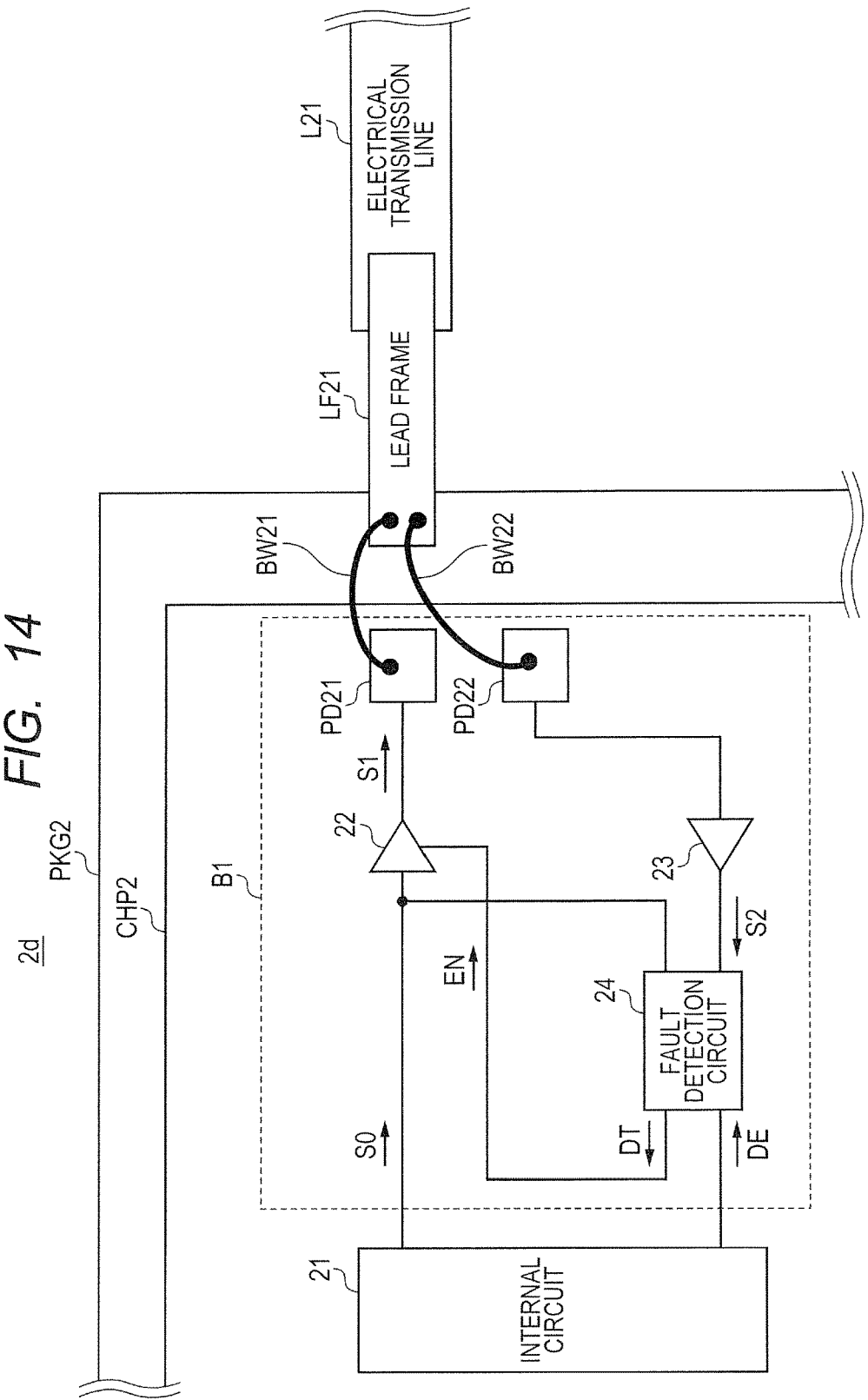

SEMICONDUCTOR DEVICE AND SEMICONDUCTOR SYSTEM EQUIPPED WITH THE SAME

CROSS-REFERENCE TO RELATED APPLICATIONS

The disclosure of Japanese Patent Application No. 2016-148043 filed on Jul. 28, 2016 including the specification, drawings and abstract is incorporated herein by reference in its entirety.

BACKGROUND

The present invention relates to a semiconductor device and a semiconductor system which is equipped with the semiconductor device and relates to, for example, the semiconductor device which is suited for detection of a fault of a bonding wire and the semiconductor system which is equipped with the semiconductor device.

Since refinement and cost reduction of the boding wire to be installed on a signal path between the semiconductor device and an external device are promoted in association with high integration of the semiconductor device, the possibility that the bonding wire may fail due to disconnection, melting and so froth is increased. Since it becomes difficult for the semiconductor device to accurately control the external device when the bonding wire has failed, the necessity of detection of the fault of the bonding wire is increased.

In particular, in the semiconductor system which controls driving of an in-vehicle motor on the basis of an output signal from the semiconductor device, it is greatly important to detect the fault of the bonding wire which has been installed on the signal path running from the semiconductor device to the in-vehicle motor also for the purpose of improving safe performance of the in-vehicle motor.

A related technology is disclosed in Japanese Unexamined Patent Application Publication No. 2009-147142. The semiconductor device disclosed in Japanese Unexamined Patent Application Publication No. 2009-147142 includes a test circuit which has first and second input terminals into which an input signal which has been supplied from the outside via the bonding wire is input respectively via first and second routes, a wiring line which has been installed such that the first route and the second route follow paths which are different from each other depending on whether bonding is normal or defective and delay means which adjusts timings that the input signal is input into the test circuit via the first route and is input into the test circuit via the second route. Then, the semiconductor device detects a bonding failure on the basis of a result of detection by the test circuit.

SUMMARY

However, the configuration disclosed in Japanese Unexamined Patent Application Publication No. 2009-147142 has such a drawback that although the fault of the bonding wire through which the input signal which is supplied from the outside to the semiconductor device propagates is detected, it is difficult to detect the fault of the bonding wire through which a signal which is output from the semiconductor device to the outside propagates. Therefore, for example, in a semiconductor system which controls driving of the in-vehicle motor on the basis of the output signal from the semiconductor device, it is difficult to detect the fault of the bonding wire which has been installed on the signal path running from the semiconductor device to the in-vehicle motor even when the configuration disclosed in Japanese Unexamined Patent Application Publication No. 2009-147142 is adopted and consequently it becomes difficult to improve the safe performance of the in-vehicle motor. Other matters to be solved and novel features of the present invention will become apparent from the description of the present specification and the appended drawings.

The present invention has been made in view of the above mentioned circumstances. According to one embodiment of the present invention, there is provided a semiconductor device which includes a semiconductor chip, a lead frame and first and second bonding wires which couple together the lead frame and the semiconductor chip, in which the semiconductor chip includes a first pad which is coupled to the first bonding wire and to which an output signal which has been generated in the semiconductor chip is supplied, a second pad which is coupled to the second bonding wire and to which a feedback signal is supplied from the lead frame and a fault detection circuit which compares the output signal which is supplied to the first pad with the feedback signal which is supplied to the second pad.

According to one embodiment of the present invention, it is possible to provide the semiconductor device which makes it possible to detect the fault of the bonding wire through which the output signal which is output from the semiconductor device propagates and a semiconductor system which is equipped with the above-mentioned semiconductor device.

BRIEF DESCRIPTION OF THE DRAWINGS

FIG. 14 is a schematic plan view illustrating a fourth altered example of the semiconductor device illustrated in FIG. 7.

DETAILED DESCRIPTION

In the following, preferred embodiments of the present invention will be described with reference to the accompanying drawings. Incidentally, the drawings are simplified ones and therefore the technical scope of the embodiments shall not be construed narrowly on the ground of the illustration of the drawings. In addition, the same symbols are assigned to the same elements and repetitive description thereof is omitted.

Although, in the following embodiments, description will be made by dividing into a plurality of sections or embodiments when division is requested for the convenience sake, these are not unrelated to one another and these are related to one another such that one covers some or all of altered examples, applied examples, detailed explanation, supplemental explanation and so forth of the other unless otherwise clearly stated in particular. In addition, in the following embodiments, in a case where a number of constitutional elements and so forth (a number of units, a numerical value, an amount/a quantity, a range and so forth are included) is referred to, it is not limited to the specific number and may be at least and/or not more than the specific number unless otherwise clearly stated in particular and unless otherwise definitely limited to the specific number in principle and so forth.

Further, in the following embodiments, the constitutional elements (operation steps and so forth are also included) thereof are not necessarily essential unless otherwise clearly stated in particular and unless otherwise thought to be clearly essential in principle. Likewise, in the following embodiments, when the shapes of the constitutional elements and so forth, a positional relationship among them and so forth are referred to, the ones which are substantially approximate or similar to the shapes and so forth thereof shall be included unless otherwise clearly stated in particular and unless otherwise clearly thought that they are not approximate or similar thereto in principle. The same is true of the above-mentioned number and so forth (the number of units, the numerical value, the amount/the quantity, the range and so forth are included).

<First Embodiment>

Figure 1:
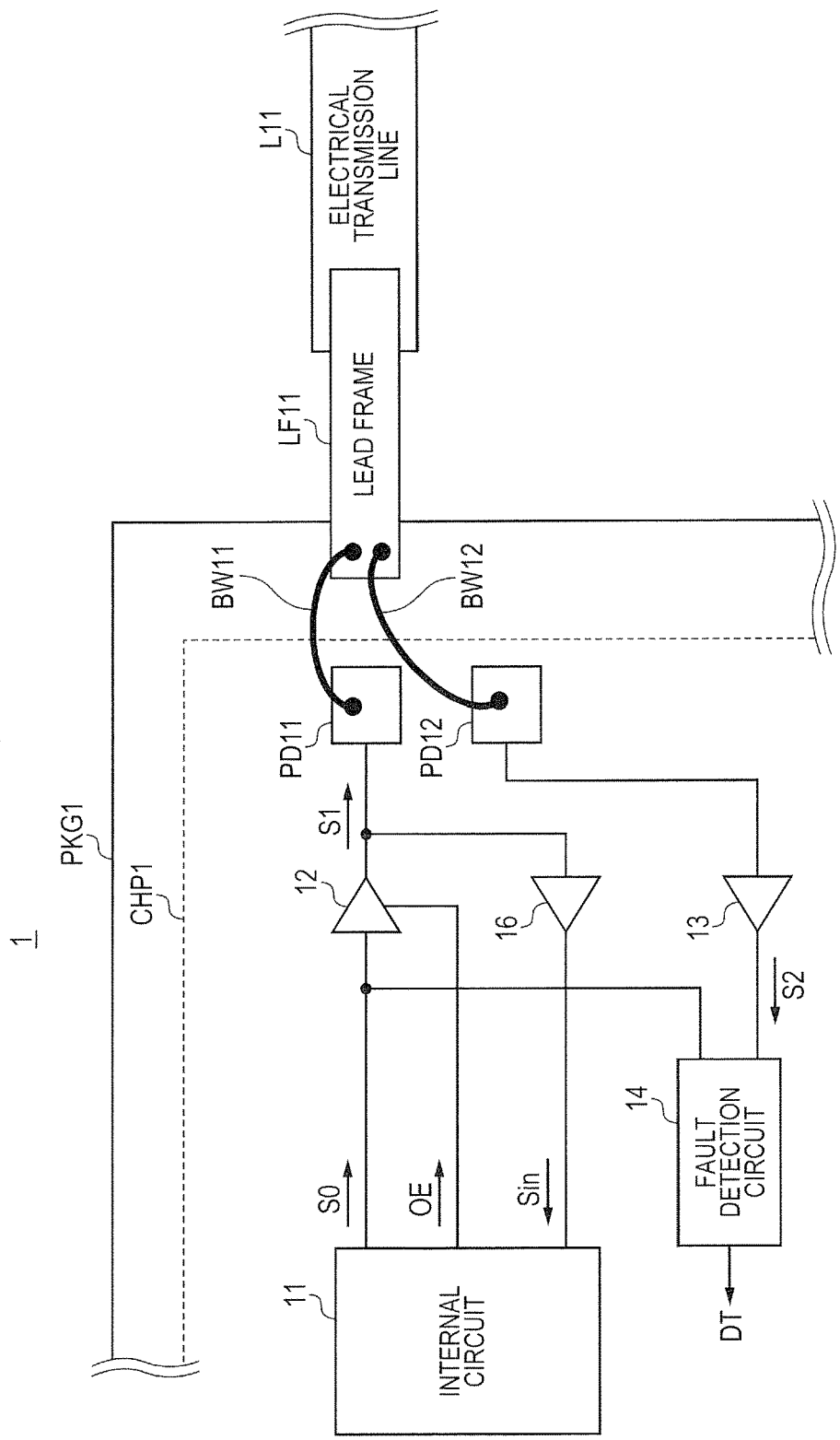
FIG. 1 is a schematic plan view illustrating one configurational example of a semiconductor device according to a first embodiment of the present invention.

FIG. 1 is a schematic plan view illustrating one configurational example of a semiconductor device 1 according to the first embodiment. The semiconductor device 1 according to the first embodiment is loaded on, for example, a vehicle and controls an inverter adapted to drive a motor. Here, the semiconductor device 1 according to the first embodiment includes first and second bonding wires which respectively couple together a first pad and a lead frame and a second pad and the lead frame, a fault detection circuit which compares an output signal which has been generated in a semiconductor chip and is supplied to the first pad with a feedback signal which is fed back from the lead frame to the second pad and so forth. Thereby, it becomes possible for the semiconductor device 1 according to the first embodiment to detect a fault of the bonding wire through which a signal which is output from the semiconductor device 1 to the outside propagates. In the following, description will be made specifically.

As illustrated in FIG. 1, at least a semiconductor chip CHP1, a lead frame LF11, a bonding wire (a first bonding wire) BW11 and a bonding wire (a second bonding wire) BW12 are installed in a package PKG1 of the semiconductor device 1.

In addition, at least an internal circuit 11, an output buffer 12, an input buffer 13, an input buffer 16, a fault detection circuit 14 and pads PD11 and PD12 are installed on the semiconductor chip CHP1. Incidentally, although in the example in FIG. 1, only one set of the pads PD11 and PD12 which corresponds to an output signal S1 is illustrated, as a matter of course, optional sets of pads which correspond to other output signals and other input signals may be installed.

The pads PD11 and PD12 are installed along an outer periphery of the semiconductor chip CHP1. The lead frame LF11 is installed in correspondence with the pads PD11 and PD12 and is installed so as to extend outward from the outer periphery of the package PKG1.

One end of the lead frame LF11 and the pad PD11 and one end of the lead frame LF11 and the pad PD12 are coupled together respectively by the bonding wires BW11 and BW12. The other end of the lead frame LF11 is coupled to one end of an electrical transmission line L11 which is installed on, for example, a board. The other end of the electrical transmission line L11 is coupled to, for example, an inverter.

The internal circuit 11 is, for example, a microcomputer and receives information which has been output from an external device such as the motor and so forth and outputs a control signal adapted to control the inverter on the basis of the information so received. In the example in FIG. 1, the internal circuit 11 receives an input signal Sin as the information supplied from the external device, outputs an output signal SO as the control signal adapted to control the inverter and outputs an enable signal OE adapted to control whether outputting of the output signal SO is permitted.

For example, when the output signal SO is to be output to the outside as the output signal S1, the internal circuit 11 makes the enable signal OE active (for example, set to an H level). Thereby, the output buffer 12 drives the output signal SO and outputs it as the output signal S1. In other words, the output buffer 12 amplifies the output signal SO to such an extent that it becomes possible for the external device to recognize the output signal SO and then outputs the output signal SO as the output signal S1. The output signal S1 is supplied to the pad PD11 and then propagates through the bonding wire BW11 and the lead frame LF11 and is supplied to the electrical transmission line L11. Then, the output signal S1 propagates through the electrical transmission line L11 and is supplied to, for example, the inverter which is not illustrated.

Here, the output signal S1 which has been supplied from the pad PD11 to the lead frame LF11 by propagating through the bonding wire BW11 is fed back to the pad PD12 by propagating through the bonding wire BW12. In the following, the signal which has been fed back from the lead frame LF11 to the pad PD12 will be referred to as a feedback signal S2.

The input buffer 13 drives and outputs the feedback signal S2 which has been fed back from the lead frame LF11 to the pad PD12. Incidentally, when the amplitude of the feedback signal S2 is sufficiently large, the input buffer 13 may not be installed.

On the other hand, when the input signal Sin from the outside is to be received, the internal circuit 11 makes the enable signal OE inactive (for example, set to an L level). Thereby, an output from the output buffer 12 is brought into a high-impedance state. In this case, the input buffer 16 drives and outputs the input signal Sin which has been supplied from the external device to the pad PD11 by propagating through the electrical transmission line L11, the lead frame LF11 and the bonding wire BW11. Then, the internal circuit 11 receives the input signal Sin which has been driven by the input buffer 16.

The fault detection circuit 14 detects not only presence/absence of the fault of the output buffer 12 but also presence/absence of the fault of the bonding wire BW11 by comparing the output signal SO with the feedback signal S2 and outputs a detection result DT.

For example, when there is no fault in the output buffer 12 and the bonding wire BW11 and a voltage level of the feedback signal S2 and a voltage level of the output signal SO match each other, the fault detection circuit 14 makes the detection result DT active (for example, set to the H level).

In contrast, when the fault has occurred in the bonding wire BW11 due to disconnection, melting and so forth and the voltage level of the feedback signal S2 and the voltage level of the output signal SO do not match each other, the fault detection circuit 14 makes the detection result DT inactive (for example, set to the L level). In this case, driving of the motor by the inverter is stopped and/or the inverter is brought into a state of being operated in a fail-safe mode by, for example, a control circuit which has been separately installed.

(Specific Configurational Example of the Fault Detection Circuit 14)

Figure 2:
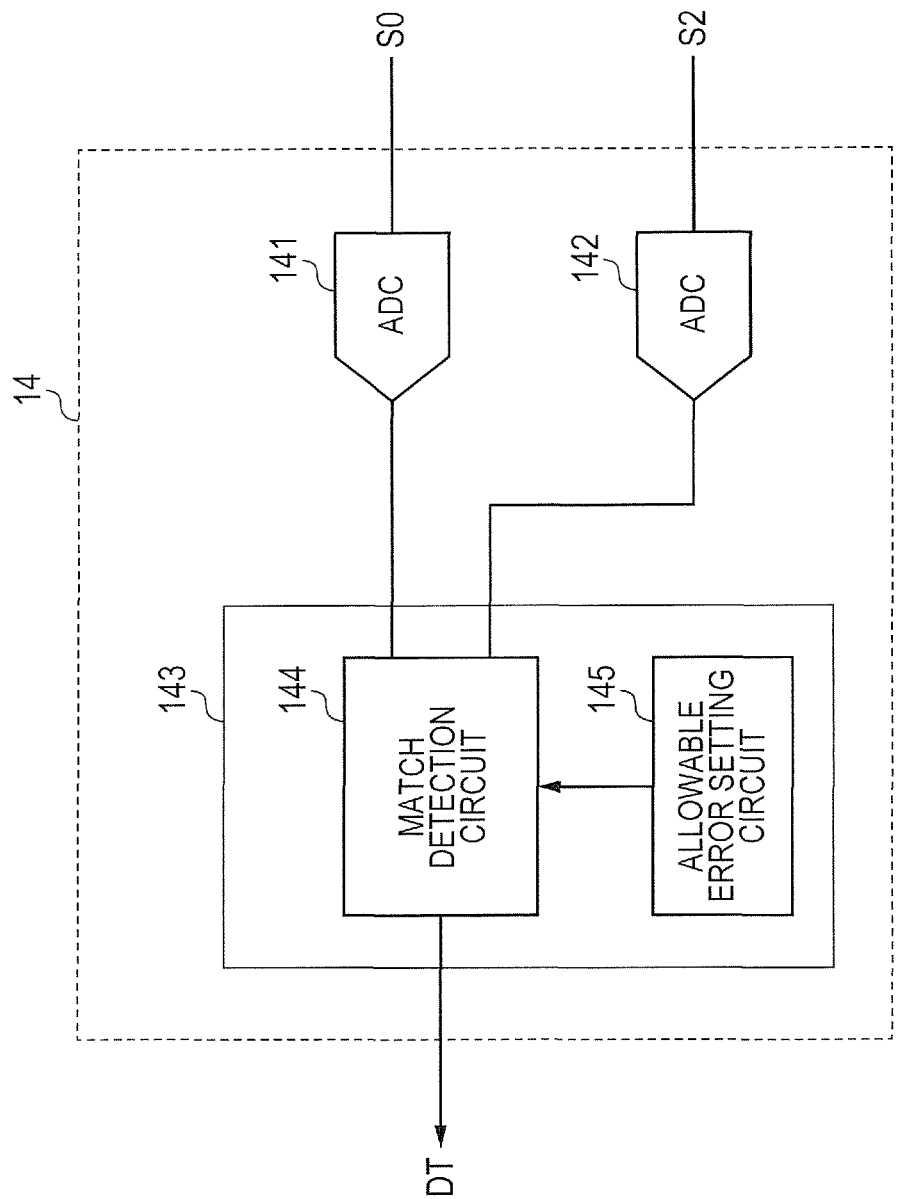
FIG. 2 is a block diagram illustrating one specific configurational example of a fault detection circuit installed in the semiconductor device illustrated in FIG. 1.

FIG. 2 is a block diagram illustrating one example of a specific configuration of the fault detection circuit 14.

As illustrated in FIG. 2, the fault detection circuit 14 includes an AD converter 141, an AD converter 142, a decision circuit 143 and so forth. The decision circuit 143 includes a match detection circuit 144, an allowable error setting circuit 145 and so forth.

The AD converter 141 converts a value of the voltage of the output signal SO into a digital value (a first digital signal) and outputs the voltage value so converted. The AD converter 142 converts a value of the voltage of the feedback signal S2 into a digital value (a second digital signal) and outputs the voltage value so converted. The match detection circuit 144 detects whether the digital value of the output signal SO which has been output from the AD converter 141 and the digital value of the feedback signal S2 which has been output from the AD converter 142 match each other and outputs the detection result DT.

For example, when the digital value of the output signal SO and the digital value of the feedback signal S2 match each other, the match detection circuit 144 makes the detection result DT active (for example, set to the H level) and when the digital value of the output signal SO and the digital value of the feedback signal S2 do not match each other, the match detection circuit 144 makes the detection result DT inactive (for example, set to the L level).

Here, there is the possibility that an error may occur between the digital value of the output signal SO and the digital value of the feedback signal S2 caused by wiring resistance and so forth. Accordingly, the allowable error setting circuit 145 sets an allowable value of the error for the match detection circuit 141. Thereby, when a difference between the digital value of the output signal SO and the digital value of the feedback signal S2 is in an allowable value range of the error, the match detection circuit 144 decides that the digital values of the output signal SO and the feedback signal S2 match each other.

Incidentally, the configuration of the fault detection circuit 14 is not limited to the configuration illustrated in FIG. 2. For example, a delay circuit may be further installed on a propagation path of the output signal SO in order to synchronize a timing that the output signal SO reaches the fault detection circuit 14 with a timing that the feedback signal S2 which corresponds to the output signal SO concerned reaches the fault detection circuit 14. Alternatively, latch circuits which respectively latch the digital value of the output signal SO and the digital value of the feedback signal S2 which corresponds to the output signal SO may be further installed.

Further, for example, the fault detection circuit 14 may have such a configuration that the voltage of the output signal SO is directly compared with the voltage of the feedback signal S2 without converting the voltages respectively into the digital values. Alternately, the fault detection circuit 14 may also have such a configuration that whether an H-level or L-level logical value of the output signal SO and an H-level or L-level logical value of the feedback signal S2 match each other is detected.

The semiconductor device 1 according to the first embodiment includes the bonding wires BW11 and BW12 which respectively couple together the pad PD11 and the lead frame LF11 and the pad PD12 and the lead frame LF11, the fault detection circuit 14 which compares the output signal SO which is a signal obtained before driven as the output signal S1 which is supplied to the pad PD11 with the feedback signal S2 which is fed back from the lead frame LF11 to the pad PD12 and so forth as described above. Thereby, it becomes possible for the semiconductor device 1 according to the first embodiment to detect the fault of the bonding wire BW11 through which the signal which is output from the semiconductor device 1 to the outside propagates.

Consequently, for example, in a semiconductor system which controls driving of the in-vehicle motor on the basis of the output signal from the semiconductor device 1, since it is possible to detect the fault of the bonding wire BW11 which is installed on a signal path running from the semiconductor device 1 to the in-vehicle motor, it is possible to improve the safe performance of the in-vehicle motor.

The configuration of the semiconductor device 1 according to the first embodiment is not limited to the above-mentioned configuration and may be appropriately altered and modified within a range not deviating from the gist of the present invention. In the following, several altered examples of the semiconductor device 1 will be briefly described.

(First Altered Example of the Semiconductor Device 1)

Figure 3:
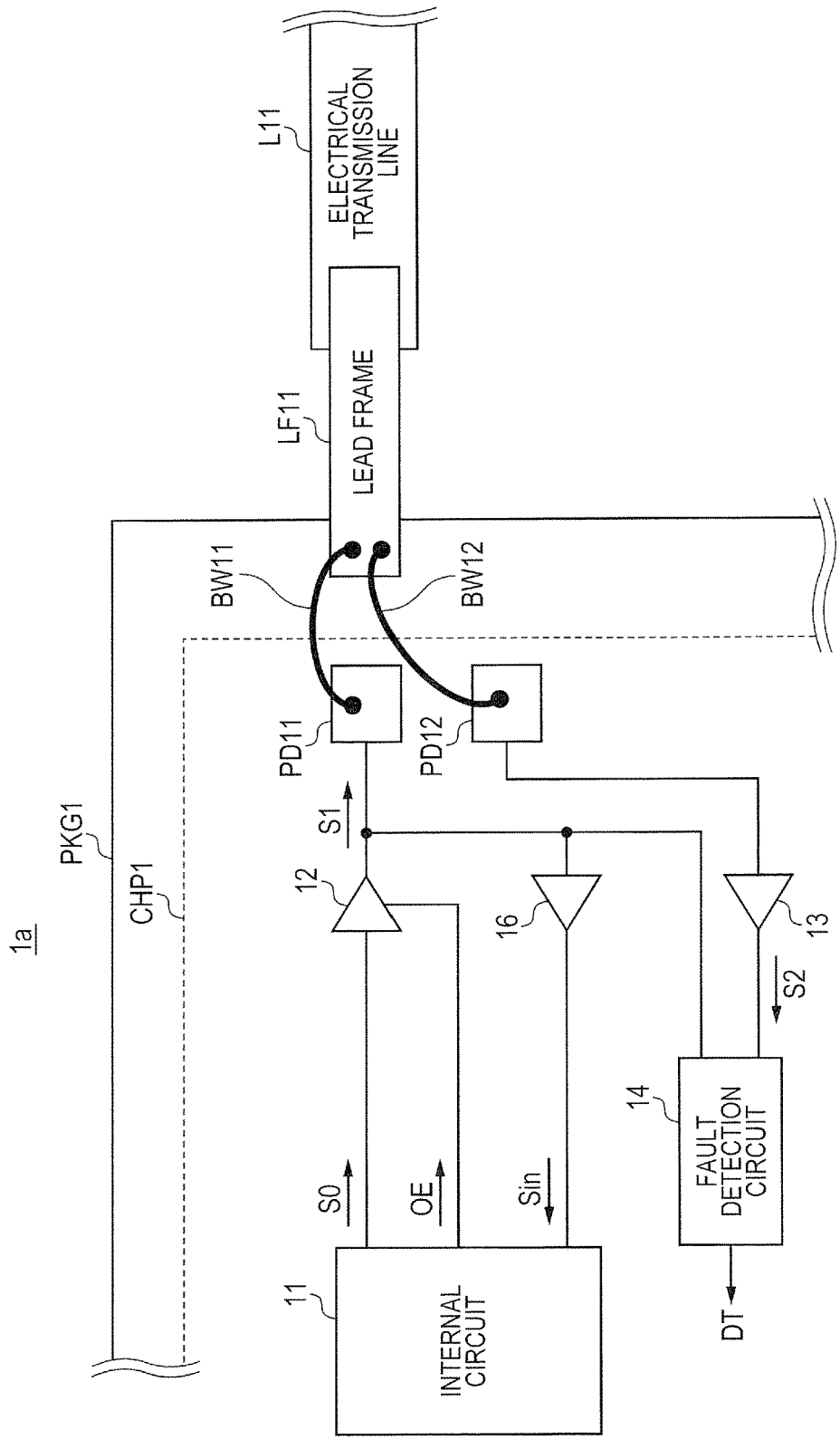
FIG. 3 is a schematic plan view illustrating a first altered example of the semiconductor device illustrated in FIG. 1.

FIG. 3 is a schematic plan view illustrating the first altered example of the semiconductor device 1 as a semiconductor device 1*a*. The semiconductor device 1*a* is different from the semiconductor device 1 in objects to be compared with each other by the fault detection circuit 14.

Specifically, the fault detection circuit 14 compares the output signal S1 obtained after driven by the output buffer 12 in place of the output signal SO obtained before driven by the output buffer 12 with the feedback signal S2. Since the configurations of other constitutional elements of the semiconductor device 1*a* are the same as those of the semiconductor device 1, description thereof is omitted.

Although it is possible for the semiconductor device 1 to detect that one of the output buffer 12 and the bonding wire BW11 has failed, it is difficult for the semiconductor device 1 to detect which one of the output buffer 12 and the binding wire BW11 has failed. In contrast, it is possible for the semiconductor device 1a to detect that the bonding wire BW11 has failed in the output buffer 12 and the bonding wire BW11.

Incidentally, a constitutional element configured to detect the fault of the output buffer 12 may be added to the configuration of the semiconductor device 1a. Thereby, it becomes possible to individually detect the faults of the output buffer 12 and the bonding wire BW11.

(Second Altered Example of the Semiconductor Device 1)

Figure 4:
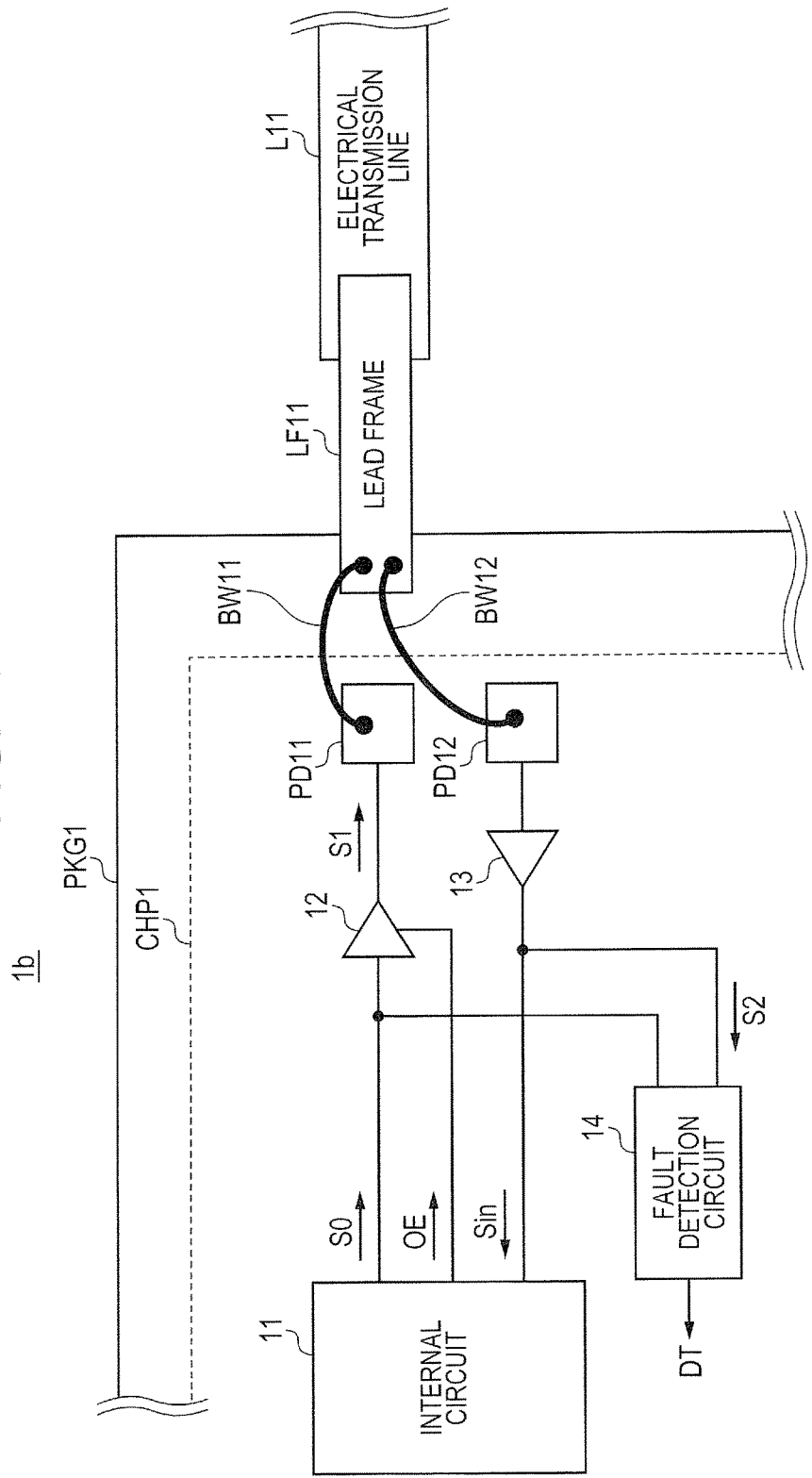
FIG. 4 is a schematic plan view illustrating a second altered example of the semiconductor device illustrated in FIG. 1.

FIG. 4 is a schematic plan view illustrating the second altered example of the semiconductor device 1 as a semiconductor device 1b. In the semiconductor device 1, outputting of the output signal S1 to the outside and supplying of the input signal Sin from the outside are both performed via the pad PD11. In contrast, in the semiconductor device 1b, outputting of the output signal S1 to the outside and supplying of the input signal Sin from the outside are respectively performed via the mutually different pads PD11 and PD12.

Accordingly, in the semiconductor device 1b, when the output signal S1 is to be output to the outside, the feedback signal S2 which is fed back from the lead frame LF11 is supplied to the pad PD12 by propagating through the bonding wire BW12 and when the input signal Sin which is supplied from the outside is to be received, the input signal Sin which is supplied from the external device such as the motor and so forth is supplied to the pad PD12 by propagating through the electrical transmission line L11, the lead frame LF11 and the bonding wire BW12.

Incidentally, in the semiconductor device 1b, since supplying of the input signal Sin from the outside and supplying of the feedback signal S2 are both performed via the pad PD12, the input buffer 13 or 16 is commonly used. In the second altered example, only the input buffer 13 is used.

For example, when the input signal Sin from the outside is to be received, the internal circuit 11 makes the enable signal OE inactive (for example, set to the L level). Thereby, the output from the output buffer 12 is brought into the high-impedance state. In this case, the input buffer 13 drives and outputs the input signal Sin which has been supplied from the external device to the pad PD12 by propagating through the electrical transmission line L11, the lead frame LF11 and the bonding wire BW12. Then, the internal circuit 11 receives the input signal Sin which has been driven by the input buffer 13.

Since the configurations of other constitutional elements of the semiconductor device 1b are the same as those of the semiconductor device 1, description thereof is omitted.

It is possible for the semiconductor device 1b to exhibit the advantageous effect which is equivalent to that of the semiconductor device 1. Further, since in the semiconductor device 1b, it is possible to commonly use the input buffer 13 or 16, it is possible to suppress an increase in circuit scale.

(Third Altered Example of the Semiconductor Device 1)

Figure 5:
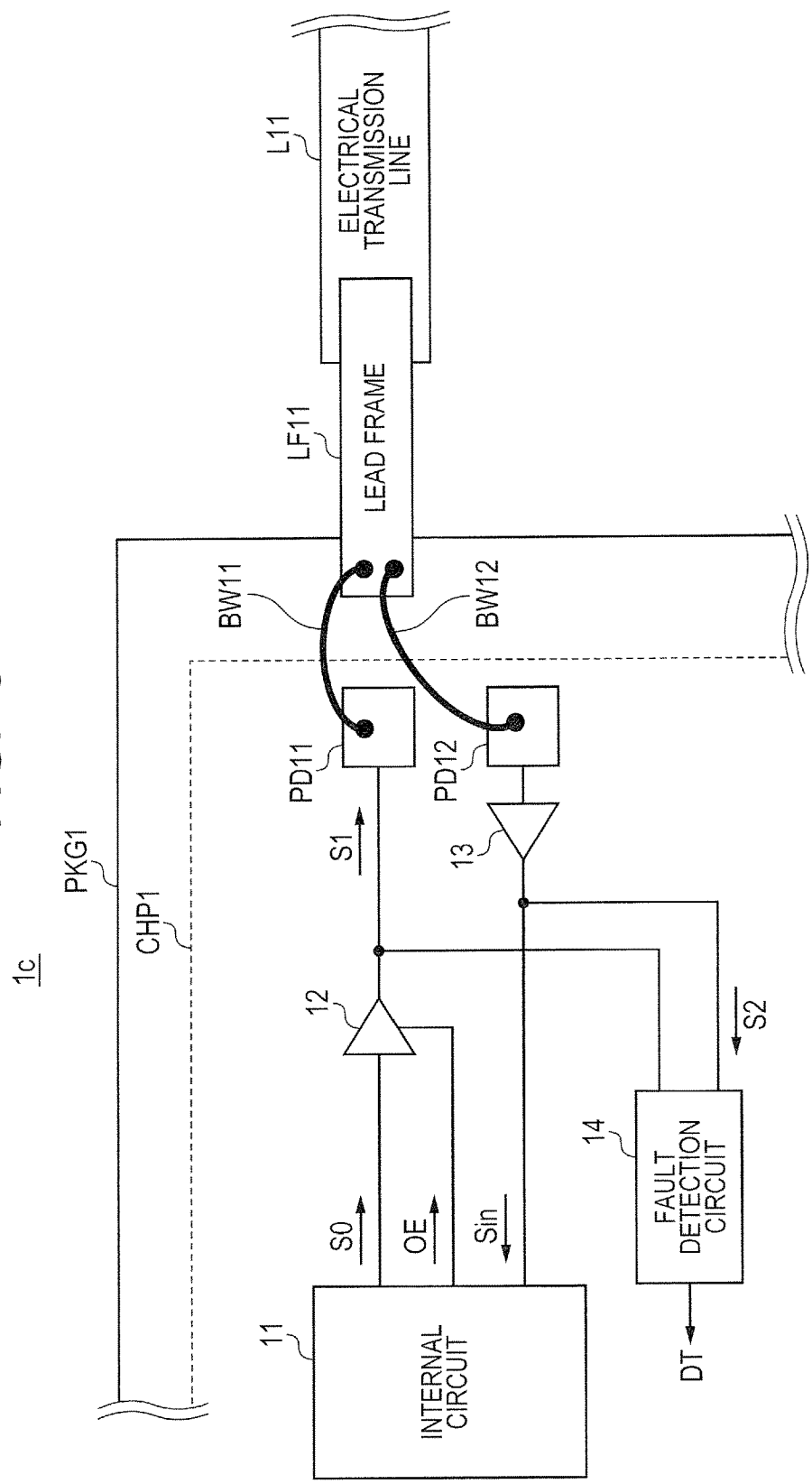
FIG. 5 is a schematic plan view illustrating a third altered example of the semiconductor device illustrated in FIG. 1.

FIG. 5 is a schematic plan view illustrating the third altered example of the semiconductor device 1 as a semiconductor device 1c. In the semiconductor device 1c, one of characteristic parts of the semiconductor device 1a and one of characteristic parts of the semiconductor device 1b are used in combination.

Specifically, in the semiconductor device 1c, the fault detection circuit 14 compares the output signal S1 obtained after driven by the output buffer 12 in place of the output signal SO obtained before driven by the output buffer 12 with the feedback signal S2. Further, in the semiconductor device 1c, outputting of the output signal S1 to the outside and supplying of the input signal Sin from the outside are performed respectively via the mutually different pads PD11 and PD12.

Since the configurations of other constitutional elements of the semiconductor device 1c are the same as those of the semiconductor device 1, description thereof is omitted.

It is possible for the semiconductor device 1c to exhibit the advantageous effects which are equivalent to those of the semiconductor device 1a and the semiconductor device 1b. That is, since in the semiconductor device 1c, it is possible to detect that the bonding wire BW11 has failed in the output buffer 12 and the bonding wire BW11 and it is also possible to commonly use the input buffer 13 or 16, it is possible to suppress the increase in circuit scale.

(Fourth Altered Example of the Semiconductor Device 1)

Figure 6:
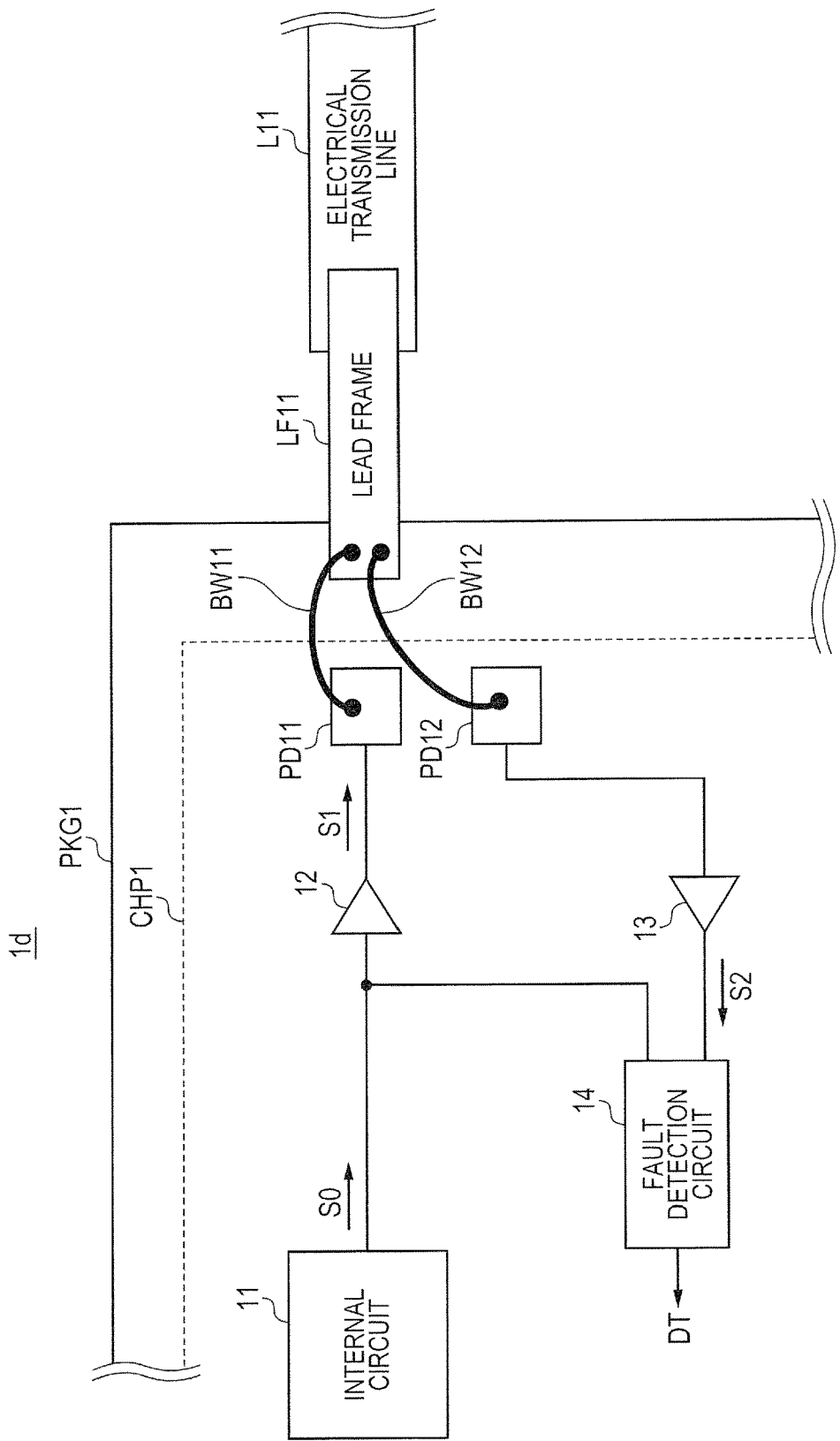
FIG. 6 is a schematic plan view illustrating a fourth altered example of the semiconductor device illustrated in FIG. 1.

FIG. 6 is a schematic plan view illustrating the fourth altered example of the semiconductor device 1 as a semiconductor device 1d. In the semiconductor device 1, outputting of the output signal S1 to the outside and supplying of the input signal Sin from the outside are performed. In contrast, in the semiconductor device 1d, only outputting of the output signal S1 to the outside is performed in outputting of the output signal S1 to the outside and supplying of the input signal Sin from the outside.

Accordingly, in the semiconductor device 1d, the propagation path for the input signal Sin is not installed. In addition, the constitutional element configured to control so as to bring the output from the output buffer 12 into the high-impedance state is not also installed. Since the configurations of other constitutional elements of the semiconductor device 1d are the same as those of the semiconductor device 1, description thereof is omitted.

It is also possible for the semiconductor device 1d to exhibit the advantageous effect which is equivalent to that of the semiconductor device 1. That is, it is possible for the semiconductor device 1d to detect the fault of the bonding wire BW11 through which the signal which is output from the semiconductor device 1d to the outside propagates. Consequently, for example, in a semiconductor system which controls driving of the in-vehicle motor on the basis of the output signal from the semiconductor device 1d, since it is possible to detect the fault of the bonding wire BW11 which is installed on a signal path running from the semiconductor device 1d to the in-vehicle motor, it is possible to improve the safe performance of the in-vehicle motor.

<Second Embodiment>

Figure 7:
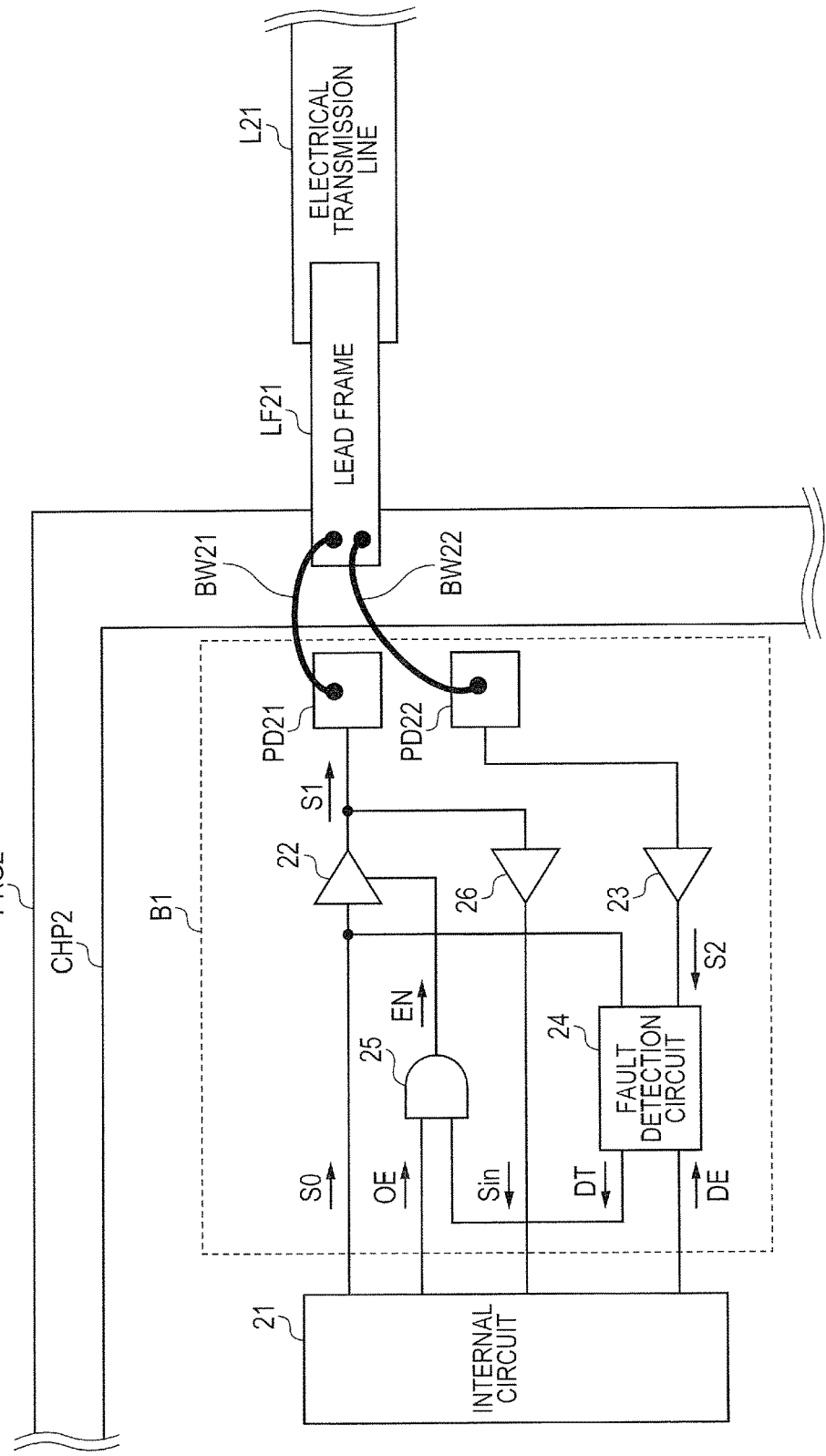
FIG. 7 is a schematic plan view illustrating one configurational example of a semiconductor device according to a second embodiment of the present invention.

FIG. 7 is a schematic plan view illustrating one configurational example of a semiconductor device 2 according to the second embodiment. The semiconductor device 2 is different from the semiconductor device 1 in that the output from the output buffer is controlled on the basis of not only the enable signal OE but also the detection result DT of a fault detection circuit 24.

As illustrated in FIG. 7, at least a semiconductor chip CHP2, a lead frame LF21, a bonding wire (a first bonding wire) BW21 and a bonding wire (a second bonding wire) BW22 are installed in a package PKG2 of the semiconductor device 2.

In addition, at least an internal circuit 21, an output buffer 22, an input buffer 23, an input buffer 26, the fault detection circuit 24, a logical product circuit (in the following, referred to as an AND circuit) 25 and pads PD21 and PD22 are installed on the semiconductor chip CH2. Incidentally, although in the example in FIG. 7, only one set of the pads PD21 and PD22 which corresponds to the output signal S1 is illustrated, as a matter of course, optional sets of the pads which correspond to other output signals and other input signals may be installed.

Incidentally, the package PKG2, the semiconductor chip CHP2, the lead frame LF21, the bonding wires BW21 and BW22, the internal circuit 21, the output buffer 22, the input buffers 23 and 26, the pads PD21 and PD22 and the fault detection circuit 24 of the semiconductor device 2 respectively correspond to the package PKG1, the semiconductor chip CHP1, the lead frame LF11, the bonding wires BW11 and BW12, the internal circuit 11, the output buffer 12, the input buffers 13 and 16, the pads PD11 and PD12 and the fault detection circuit 14 of the semiconductor device 1.

The AND circuit 25 outputs a logical product of the enable signal OE which has been output from the internal circuit 21 and the detection result DT from the fault detection circuit 24 as an enable signal EN. An output from the output buffer 22 is controlled on the basis of the enable signal EN. Since control of the output from the output buffer 22 on the basis of the enable signal EN is the same as control of the output from the output buffer 12 on the basis of the enable signal OE, description thereof is omitted.

Whether a fault detection function of the fault detection circuit 24 is to be enabled is controlled on the basis of a detection permission signal DE from the internal circuit 21. For example, when the detection permission signal DE is at the L level, the fault detection function of the fault detection circuit 24 is disabled. Specifically, the fault detection circuit 24 keeps outputting the H-level detection result DT. Thereby, since the value of the enable signal OE is propagated to the enable signal EN as it is, the output from the output buffer 22 is brought into a state which is equivalent to a state of being controlled on the basis of the enable signal OE from the internal circuit 21. In contrast, when the detection permission signal DE is at the H level, the fault detection function of the fault detection circuit 24 is enabled. Specifically, the fault detection circuit 24 detects presence/absence of the faults of the output buffer 22 and the bonding wire BW21 by comparing the output signal SO with the feedback signal S2 and outputs the detection result DT.

For example, when the output buffer 22 and the bonding wire BW21 do not fail and the voltage level of the feedback signal S2 and the voltage level of the output signal SO match each other, the fault detection circuit 24 outputs the H-level detection result DT. In this case, since the value of the enable signal OE is propagated to the enable signal EN as it is, the output from the output buffer 22 is brought into the state which is equivalent to the stat of being controlled on the basis of the enable signal OE from the internal circuit 21. That is, in the semiconductor device 2, a normal operation is performed.

In contrast, when the bonding wire BW21 has failed due to disconnection, melting and so forth and the voltage level of the feedback signal S2 and the voltage level of the output signal SO do not match each other, the fault detection circuit 24 outputs the L-level detection result DT. In this case, since the enable signal EN is fixed to the L level regardless of the value of the enable signal OE, the output from the output buffer 22 is brought into the high-impedance state. That is, the output from the output buffer 22 is forcibly stopped. Thereby, since the output signal S1 is not supplied from the semiconductor device 2 to the inverter, unintentional driving of the motor by the inverter is not performed any more.

Since the configurations of other constitutional elements of the semiconductor device 2 are the same as those of the semiconductor device 1, description thereof is omitted.

Although in the second embodiment, the configurational example that the output from the output buffer 22 is brought into the high-impedance state when the fault has been detected by the fault detection circuit 24 has been described, the second embodiment is not limited to this configurational example. The semiconductor device 2 may also have such a configuration that when the fault has been detected by the fault detection circuit 24, the output buffer 22 fixes the output to a predetermined voltage level so as to atop unintentional driving of the motor by the inverter.

(First Specific Configurational Example of the Fault Detection Circuit 24)

Figure 8:
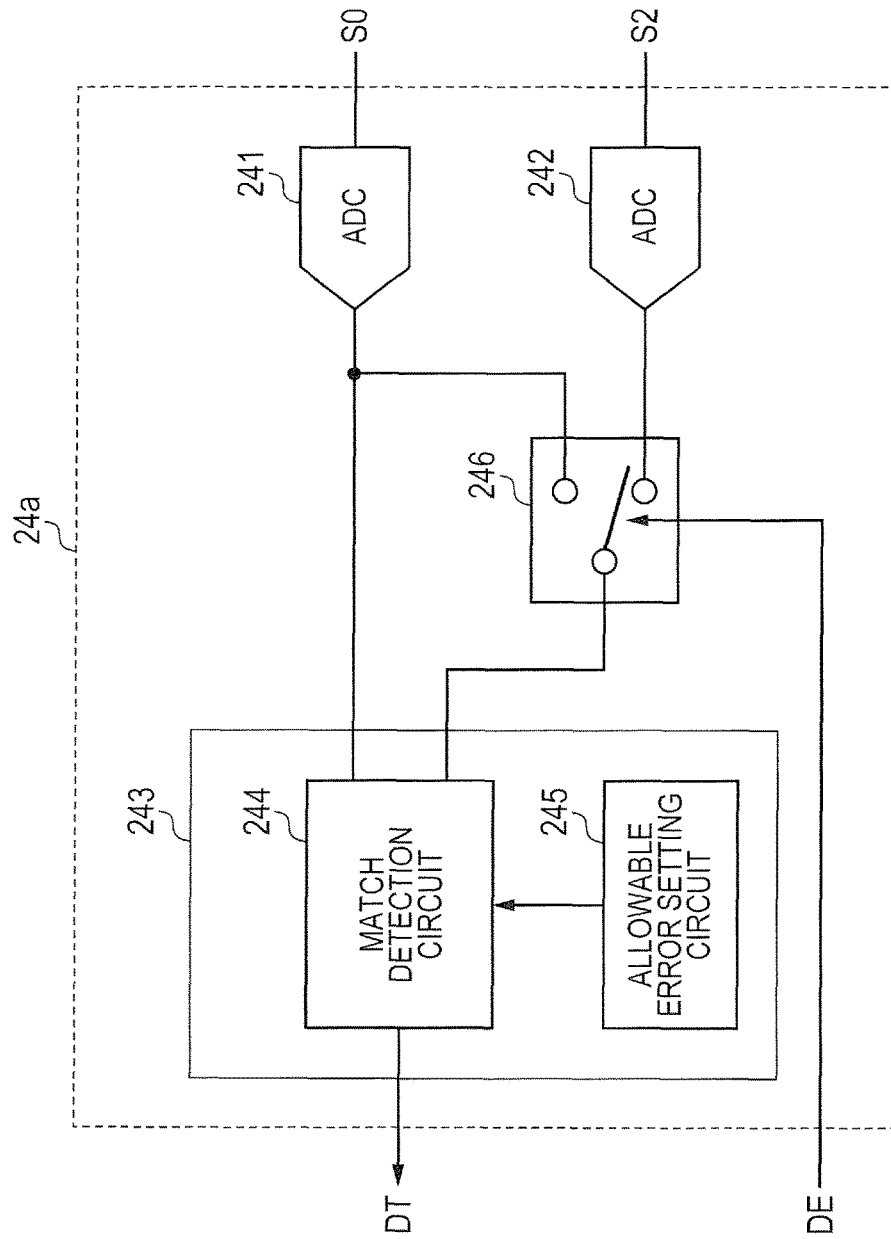
FIG. 8 is a block diagram illustrating a first specific configurational example of a fault detection circuit installed in the semiconductor device illustrated in FIG. 7.

FIG. 8 is a diagram illustrating the first specific configurational example of the fault detection circuit 24 as a fault detection circuit 24a. As illustrated in FIG. 8, the fault detection circuit 24a includes an AD converter 241, an AD converter 242, a decision circuit 243, a selection circuit 246 and so forth. The decision circuit 243 includes a match detection circuit 244, an allowable error setting circuit 245 and so forth.

Incidentally, the AD converters 241 and 242, the decision circuit 243, the match detection circuit 244 and the allowable error setting circuit 245 of the fault detection circuit 24a respectively correspond to the AD converters 141 and 142, the decision circuit 143, the match detection circuit 144 and the allowable error setting circuit 145 of the fault detection circuit 14.

The selection circuit 246 selects and outputs one of a digital value of the output signal SO which has been output from the AD converter 241 and a digital value of the feedback signal S2 which has been output from the AD converter 242 on the basis of the detection permission signal DE.

For example, when the fault detection function of the fault detection 24 is to be disabled, the selection circuit 246 selects and outputs the digital value of the output signal SO which has been output from the AD converter on the basis of the L-level detection permission signal DE. In this case, since the digital value of the output signal SO is input into both input terminals of the match detection circuit 244, the match detection circuit 244 keeps outputting the H-level detection result DT indicating that the digital values so input into both of the input terminals match each other. Thereby, since the value of the enable signal OE is propagated to the enable signal EN as it is, the output from the output buffer 22 is brought into the state which is equivalent to the state of being controlled on the basis of the enable signal OE from the internal circuit 21.

In contrast, when the fault detection function of the fault detection circuit 24 is to be enabled, the selection circuit 246 selects and outputs the digital value of the feedback signal which has been output from the AD converter 242 on the basis of the H-level detection permission signal DE. In this case, the match detection circuit 244 detects whether the digital value of the output signal SO which has been output from the AD converter 241 and the digital value of the feedback signal S2 which has been output from the AD converter 242 match each other and outputs the detection result DT.

Since the configurations of other constitutional elements of the fault detection circuit 24a are the same as those of the fault detection circuit 14, description thereof is omitted.

Incidentally, the configuration of the fault detection circuit 24a is not limited to the configuration illustrated in FIG. 8. For example, a delay circuit may be further installed on the propagation path of the output signal SO in order to synchronize a timing that the output signal SO reaches the fault detection circuit 24a with a timing that the feedback signal S2 which corresponds to the output signal SO reaches the fault detection circuit 24a. Alternatively, latch circuits which respectively latch the digital value of the output signal SO and the digital value of the feedback signal S2 which corresponds to the output signal SO may be further installed.

Further, for example, the fault detection circuit 24a may also have such a configuration that the voltage of the output signal SO is directly compared with the voltage of the feedback signal S2 without respectively converting the voltages into digital values. Alternatively, the fault detection circuit 24a may also have such a configuration that whether the H-level or L-level logical value of the output signal and the H-level or L-level logical value of the feedback signal S2 match each other is detected.

(Second Specific Configurational Example of the Fault Detection Circuit 24)

Figure 9:
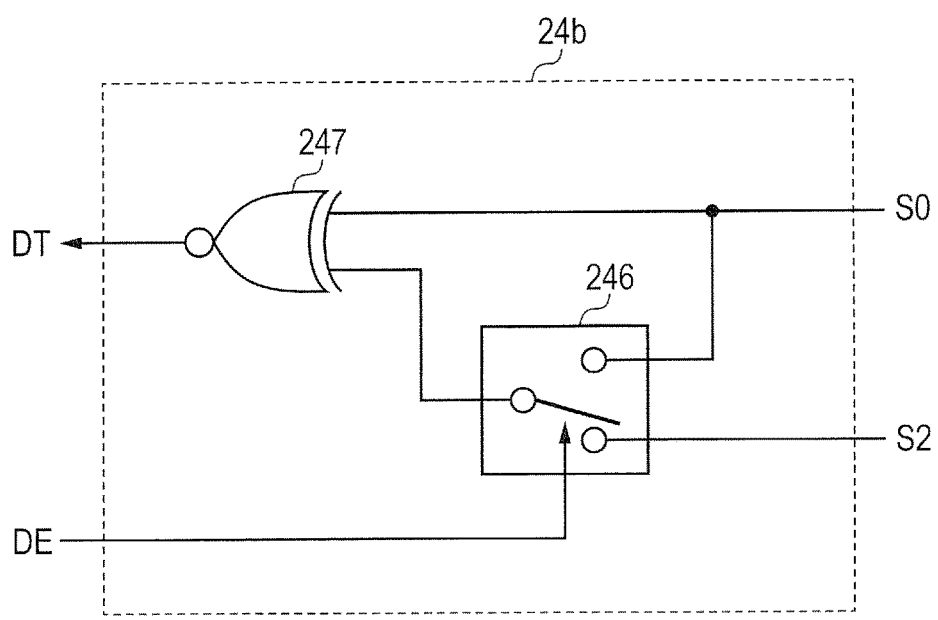
FIG. 9 is a block diagram illustrating a second specific configurational example of the fault detection circuit installed in the semiconductor device illustrated in FIG. 7.

FIG. 9 is a diagram illustrating the second specific configurational example of the fault detection circuit 24 as a fault detection circuit 24b. The fault detection circuit 24b is a configurational example that whether the H-level or L-level logical value of the output signal SO and the H-level or L-level logical value of the feedback signal S2 match each other is detected.

As illustrated in FIG. 9, the fault detection circuit 24b includes the selection circuit 246, an exclusive negative logical sum circuit (in the following, referred to as an XNOR circuit) 247 and so forth. The XNOR circuit 247 corresponds to the match detection circuit 244 in the fault detection circuit 24a.

For example, when the detection permission signal DE is at the L level, the selection circuit 246 selects and outputs the output signal SO. In this case, since the output signal SO is input into both of input terminals of the XNOR circuit 247, the XNOR circuit 247 keeps outputting the H-level detection result DT. In contrast, when the detection permission signal is at the H level, the selection circuit 246 selects and outputs the feedback signal S2. In this case, the XNOR circuit 247 outputs an exclusive negative logical sum of the output signal SO and the feedback signal S2 as the detection result DT.

The semiconductor device 2 according to the second embodiment includes the bonding wires BW21 and BW22 which respectively couple together the pad PD21 and the lead frame LF21 and the pad PD22 and the lead frame LF21, the fault detection circuit 24 which compares the output signal SO which is the signal obtained before driven as the output signal S1 which is supplied to the pad PD21 with the feedback signal S2 which is fed back from the lead frame LF21 to the pad PD22 and so forth as described above. Thereby, it becomes possible for the semiconductor device 2 according to the second embodiment to detect the fault of the bonding wire BW21 through which the signal which is output from the semiconductor device 2 to the outside propagates.

Consequently, for example, in a semiconductor system which controls driving of the in-vehicle motor on the basis of the output signal from the semiconductor device 2, since it is possible to detect the fault of the bonding wire BW21 which is installed on the signal path running from the semiconductor device 2 to the in-vehicle motor, it is possible to improve the safe performance of the in-vehicle motor.

(Application Examples of the Semiconductor Device 2)

Figure 10:
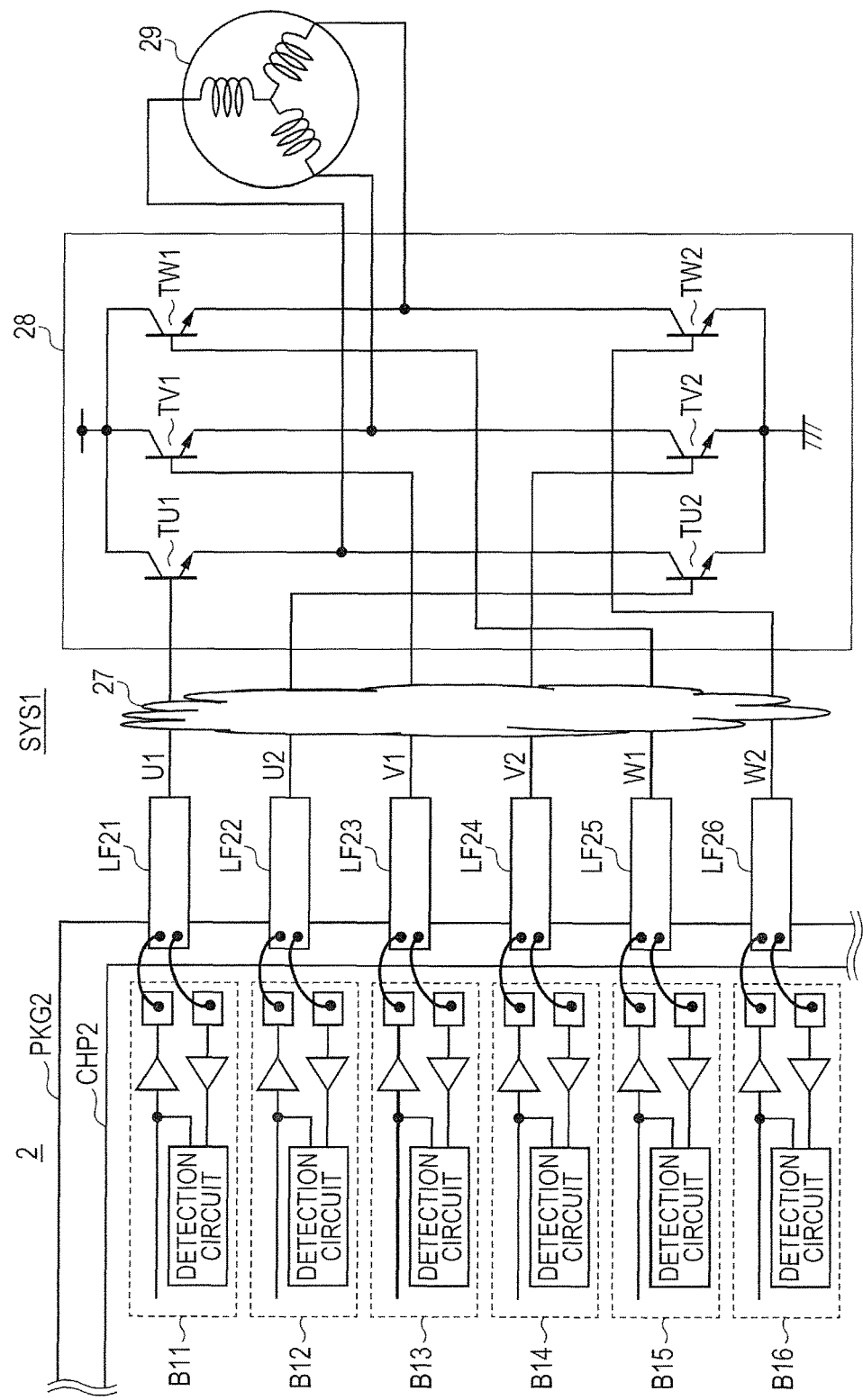
FIG. 10 is a diagram illustrating one configurational example of a semiconductor system on which the semiconductor device illustrated in FIG. 7 is loaded.

FIG. 10 is a diagram illustrating one configurational example of a semiconductor system SYS1 on which the semiconductor device 2 is loaded.

The semiconductor system SYS1 is, for example, an electronic control unit which controls driving of the in-vehicle motor and includes at least the semiconductor device 2, an AC coupled element 27 such as a photo-coupler and so forth and an inverter 28. Incidentally, also a three-phase AC motor 29 is illustrated in FIG. 10.

The semiconductor device 2 includes a plurality of blocks B11 to B16 each including an output buffer, a bonding wire through which an output signal from the output buffer propagates, a bonding wire through which a feedback signal of the output signal propagates, a fault detection circuit and so forth. The specific circuit configuration of each of the blocks B11 to B16 is the same as that of, for example, a block B1 illustrated in FIG. 7.

Respective sets of the bonding wires in the respective blocks B11 to B16 are coupled to respective lead frames LF21 to LF26. Output signals U1, U2, V1, V2, W1 and W2 which are output from the respective lead frames LF21 to LF26 to the outside are applied to respective bases of bipolar transistors (in the following, simply referred to as transistors) TU1, TU2, TV1, TV2, TW1 and TW2 which configure the inverter 28 via the AC coupled element 27 such as the photo-coupler and so forth.

In the inverter 28, the transistors TU1 and TU2 are installed in series between a power source voltage terminal and a ground voltage terminal and the output signals U1 and U2 from the semiconductor device 2 are applied to the respective bases thereof. The transistors TV1 and TV2 are installed in series between the power source voltage terminal and the ground voltage terminal and the output signals V1 and V2 from the semiconductor device 2 are applied to the respective bases thereof. The transistors TW1 and TW2 are installed in series between the power source voltage terminal and the ground voltage terminal and the output signals W1 and W2 from the semiconductor device 2 are applied to the respective bases thereof. An AC signal U which is one of three-phase AC signals is output from a coupling node between the transistors TU1 and TU2. An AC signal V which is one of the three-phase AC signals is output from a coupling node between the transistors TV1 and TV2. An AC signal W which is one of the three-phase AC signals is output from a coupling node between the transistors TW1 and TW2. Then, the number of rotations of the three-phase AC motor 29 is controlled on the basis of the thee-phase AC signals U, V and W.

The configuration of the semiconductor device 2 according to the second embodiment is not limited to the above-mentioned configuration and maybe appropriately altered and modified within a range not deviating from the gist of the present invention. In the following, several altered examples of the semiconductor device 2 will be briefly described.

(First Altered Example of the Semiconductor Device 2)

Figure 11:
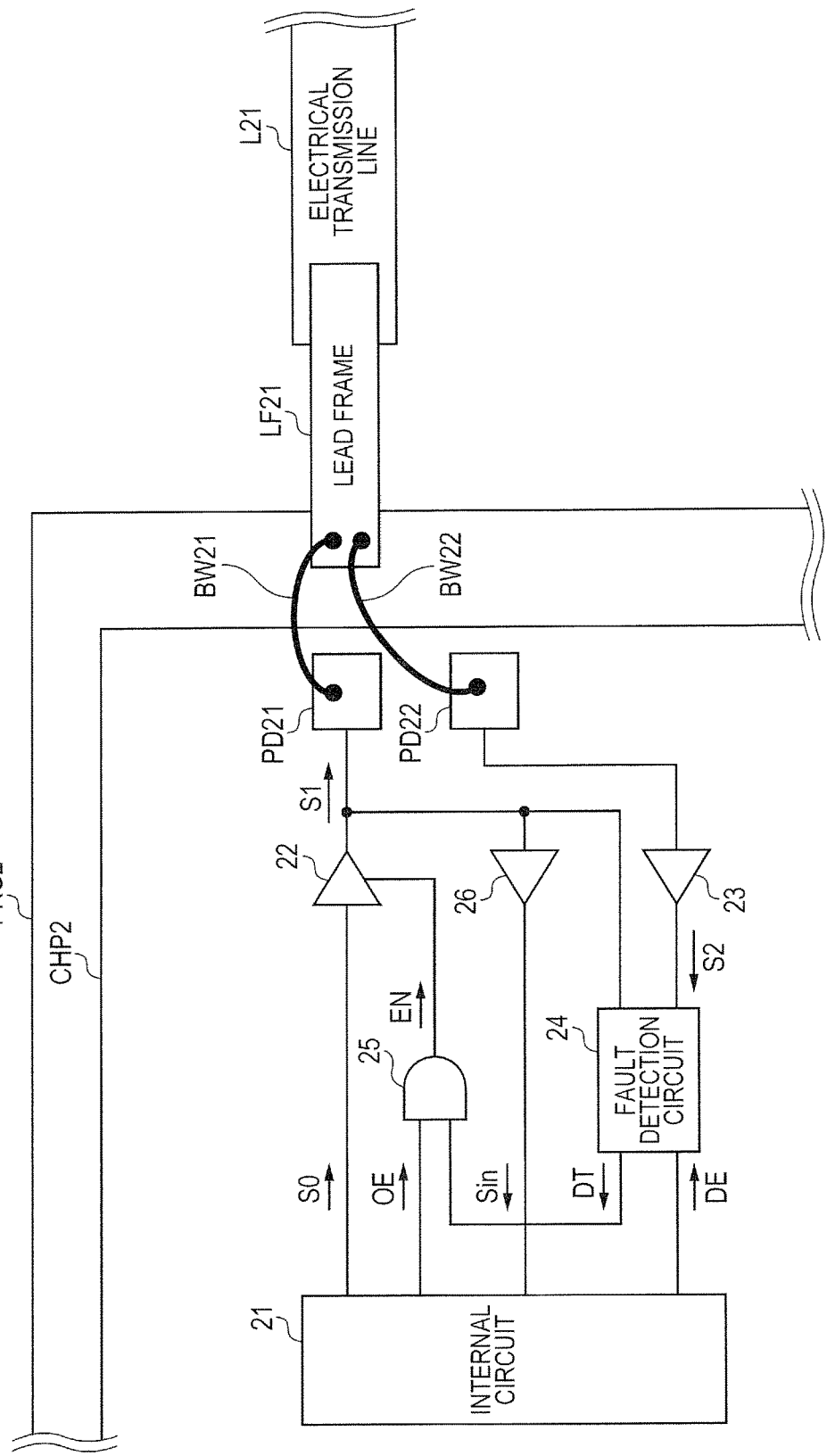
FIG. 11 is a schematic plan view illustrating a first altered example of the semiconductor device illustrated in FIG. 7.

FIG. 11 is a schematic plan view illustrating the first altered example of the semiconductor device 2 as a semiconductor device 2a. The semiconductor device 2a is different from the semiconductor device 2 in objects to be compared with each other by the fault detection circuit 24.

Specifically, the fault detection circuit 24 compares the output signal 51 obtained after driven by the output buffer 22 in place of the output signal SO obtained before driven by the output buffer 22 with the feedback signal S2. Since the configurations of other constitutional elements of the semiconductor device 2a are the same as those of the semiconductor device 2, description thereof is omitted.

Although in the semiconductor device 2, it is possible to detect that one of the output buffer 22 and the bonding wire BW21 has failed, it is difficult to detect which one of the output buffer 22 and the bonding wire BW21 has failed. In contrast, in the semiconductor device 2a, it is possible to detect that the bonding wire BW21 has failed in the output buffer 22 and the bonding wire BW21.

Incidentally, a constitutional element configured to detect the fault of the output buffer 22 may be further added to the configuration of the semiconductor device 2a. Thereby, it becomes possible to individually detect the faults of the output buffer 22 and the bonding wire BW21.

(Second Altered Example of the Semiconductor Device 2)

Figure 12:
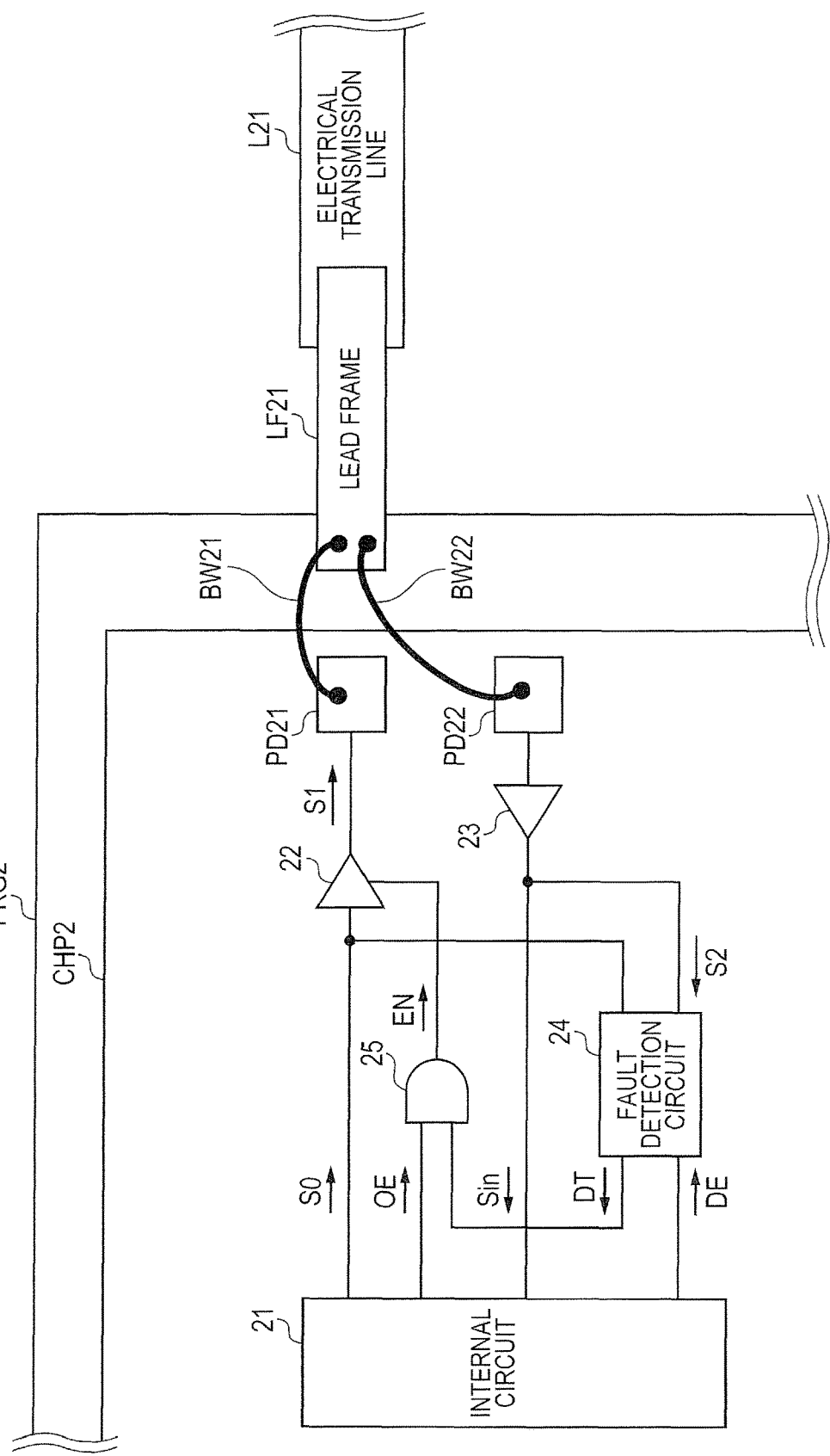
FIG. 12 is a schematic plan view illustrating a second altered example of the semiconductor device illustrated in FIG. 7.

FIG. 12 is a schematic plan view illustrating the second altered example of the semiconductor device 2 as a semiconductor device 2b. In the semiconductor device 2, outputting of the output signal 51 to the outside and supplying of the input signal Sin from the outside are both performed via the pad PD21. In contrast, in the semiconductor device 2b, outputting of the output signal 51 to the outside and supplying of the input signal Sin from the outside are respectively performed via the mutually different pads PD21 and PD22.

Accordingly, in the semiconductor device 2b, when the output signal 51 is to be output to the outside, the feedback signal S2 from the lead frame LF21 is supplied to the pad PD22 by propagating through the bonding wire BW22, and when the input signal Sin is to be received from the outside, the input signal Sin from the external device such as the motor and so forth is supplied to the pad PD22 by propagating through the electrical transmission line L21, the lead frame LF21 and the bonding wire BW22.

Incidentally, since in the semiconductor device 2b, supplying of the input signal Sin from the outside and supplying of the feedback signal S2 are both performed via the pad PD22, the input buffer 23 or 26 is commonly used. In the second altered example, only the input buffer 23 is used.

For example, when the input signal Sin from the outside is to be received, the internal circuit 21 makes the enable signal OE inactive (for example, set to the L level). Thereby, the output from the output buffer 22 is brought into the high-impedance state. In this case, the input buffer 23 drives and outputs the input signal Sin which has been supplied from the external device to the pad PD22 by propagating through the electrical transmission line L21, the lead frame LF21 and the bonding wire BW22. Then, the internal circuit 21 receives the input signal Sin which has been driven by the input buffer 23.

Since the configurations of other constitutional elements of the semiconductor device 2b are the same as those of the semiconductor device 2, description thereof is omitted.

It is possible for the semiconductor device 2b to exhibit the advantages effect which is equivalent to that of the semiconductor device 2. Further, since in the semiconductor device 2b, it is possible to commonly use the input buffer 23 or 26, it is possible to suppress the increase in circuit scale.

(Third Altered Example of the Semiconductor Device 2)

Figure 13:
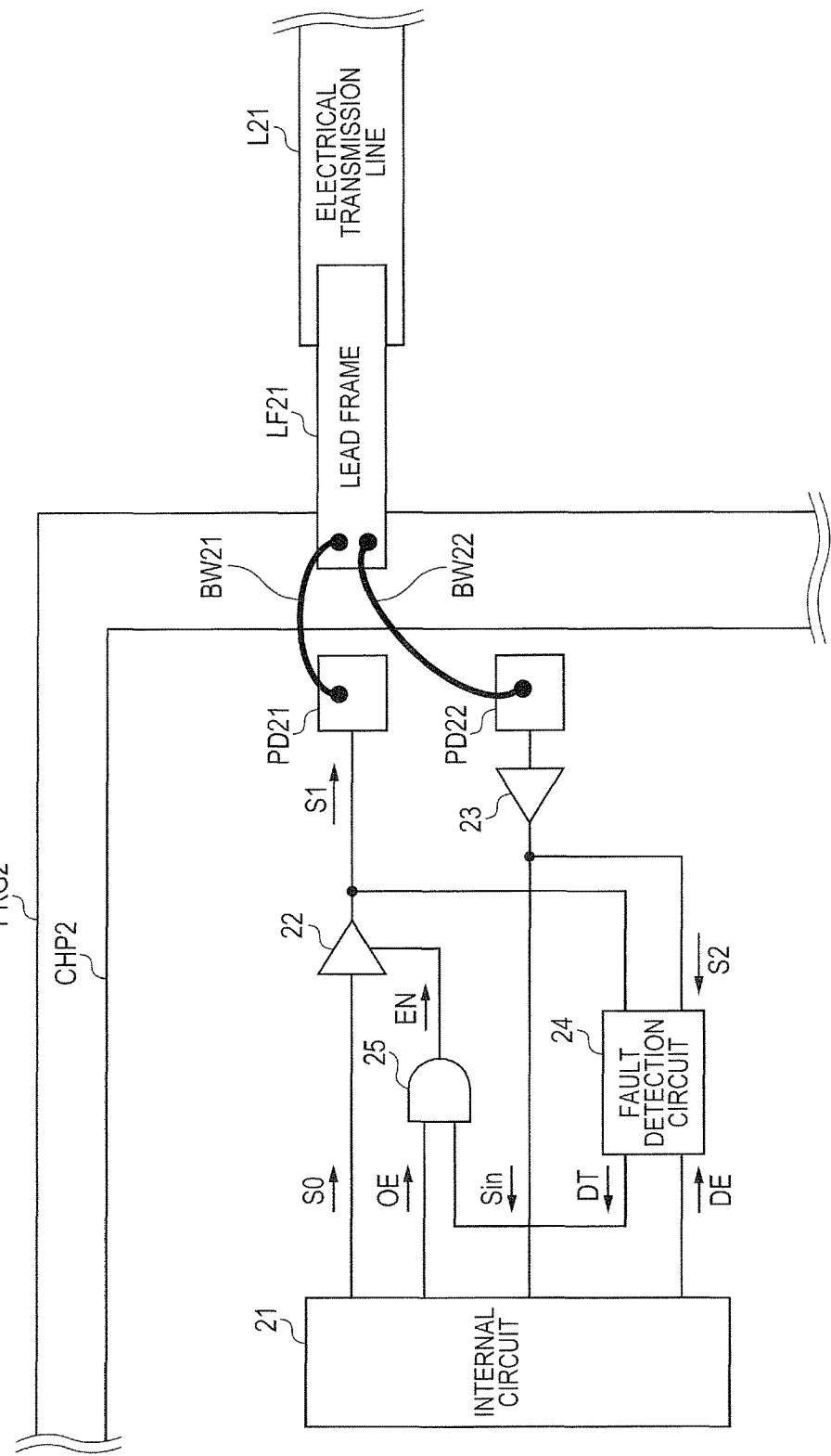
FIG. 13 is a schematic plan view illustrating a third altered example of the semiconductor device illustrated in FIG. 7.

FIG. 13 is a schematic plan view illustrating the third altered example of the semiconductor device 2 as a semiconductor device 2c. In the semiconductor device 2c, one of characteristic parts of the semiconductor device 2a and one of characteristic parts of the semiconductor device 2b are used in combination.

Specifically, in the semiconductor device 2c, the fault detection circuit 24 compares the output signal S1 which is output from the output buffer 22 in place of the output signal SO which is input into the output buffer 22 with the feedback signal S2. Further, in the semiconductor device 2c, outputting of the output signal S1 to the outside and supplying of the input signal Sin from the outside are respectively performed via the mutually different pads PD21 and PD22.

Since the configurations of other constitutional elements of the semiconductor device 2c are the same as those of the semiconductor device 2, description thereof is omitted.

It is possible for the semiconductor device 2c to exhibit the advantageous effects which are respectively equivalent to those of the semiconductor device 2a and the semiconductor device 2b. That is, since in the semiconductor device 2c, it is possible to detect that the bonding wire BW21 has failed in the output buffer 22 and the bonding wire BW21 and it is also possible to commonly use the input buffer 23 or 26, it is possible to suppress the increase in circuit scale.

(Fourth Altered Example of the Semiconductor Device 2)

FIG. 14 is a schematic plan view illustrating the fourth altered example of the semiconductor device 2 as a semiconductor device 2d. In the semiconductor device 2, outputting of the output signal S1 to the outside and supplying of the input signal Sin from the outside are performed. In contrast, in the semiconductor device 2d, only outputting of the output signal S1 to the outside is performed in outputting of the output signal S1 to the outside and supplying of the input signal Sin from the outside.

Accordingly, in the semiconductor device 2d, the propagation path of the input signal Sin is not installed. In addition, a constitutional element configured to control so as to bring the output from the output buffer 22 into the high-impedance state by the internal circuit 21 is not also installed. That is, the signal line of the enable signal OE and the AND circuit 25 are not installed. Since the configurations of other constitutional elements of the semiconductor device 2d are the same as those of the semiconductor device 2, description thereof is omitted.

It is also possible for the semiconductor device 2d to exhibit the advantageous effect which is equivalent to that of the semiconductor device 2. That is, it is possible for the semiconductor device 2d to detect the fault of the bonding wire BW21 through which the signal which is output from the semiconductor device 2d to the outside propagates. Consequently, for example, in a semiconductor system which controls driving of the in-vehicle motor on the basis of the output signal from the semiconductor device 2d, since it is possible to detect the fault of the bonding wire BW21 which is installed on the signal path running from the semiconductor device 2d to the in-vehicle motor, it is possible to improve the safe performance of the in-vehicle motor.

As described above, the semiconductor devices 1 and 2 according to the above-mentioned first and second embodiments each includes the two bonding wires which respectively couple together one of the two pads with the lead frame and the other of the two pads and the lead frame, the fault detection circuit which compares the output signal S1 (or the output signal SO which is the signal obtained before driven as the output signal S1) which is supplied to one of the two pads with the feedback signal S2 which is fed back from the lead frame to the other of the two pads and so forth. Thereby, it is possible for the semiconductor devices 1 and 2 according to the above-mentioned first and second embodiments to detect the fault of the bonding wire through which the signal which is output from the semiconductor device concerned to the outside propagates.

Consequently, for example, in the semiconductor system which controls driving of the in-vehicle motor on the basis of the output signal from the semiconductor device 1 or 2, since it is possible to detect the fault of the bonding wire which is installed on the signal path running from the semiconductor device 1 or 2 to the in-vehicle motor, it is possible to improve the safe performance of the in-vehicle motor.

Although the invention which has been made by the inventors and others has been specifically described on the basis of the embodiment thereof as mentioned above, it goes without saying that the present invention is not limited to the above-mentioned embodiments and may be altered and modified in a variety of ways within a range not deviating from the gist of the present invention.

For example, in the semiconductor devices according to the above-mentioned embodiments, a configuration that the conductivity type (the p-type or the n-type) of each of a semiconductor substrate, a semiconductor layer, a diffusion layer (a diffusion region) and so forth has been inverted may be adopted. Accordingly, when the conductivity type of one of the n-type and the p-type has been defined as a first conductivity type and the conductivity type of the other of the n-type and the p-type has been defined as a second conductivity type, it is also possible to define the first conductivity type as the p-type and to define the second conductivity type as the n-type and it is also possible to define the first conductivity type as the n-type and to define the second conductivity type as the p-type reversely.

What is claimed is:

1. A semiconductor device comprising:
   a semiconductor chip;
   a lead frame; and
   first and second bonding wires which couple together the lead frame and the semiconductor chip,
   wherein the semiconductor chip includes:
      a first pad which is coupled to the first bonding wire and to which an output signal which has been generated in the semiconductor chip is supplied;
      a second pad which is coupled to the second bonding wire and to which a feedback signal is supplied from the lead frame, the feedback signal being the output signal that propagated through the first bonding wire to the lead frame and is fed back to the second pad by propagating through the second bonding wire; and
      a fault detection circuit configured to receive the output signal prior to the output signal being supplied to the first pad and to detect a fault in the first bonding wire based on a result obtained by comparing the output signal which is supplied to the first pad with the feedback signal which is supplied to the second pad.

2. The semiconductor device according to claim 1, wherein the fault detection circuit decides that a fault has occurred when a difference between the respective voltage levels of the output signal and the feedback signal is at least a predetermined value.

3. The semiconductor device according to claim 1, wherein the fault detection circuit decides that a fault has occurred when logical values of the output signal and the feedback signal are different from each other.

4. The semiconductor device according to claim 1, wherein the semiconductor chip further includes an output buffer which outputs the output signal when a fault is not detected by the fault detection circuit and stops outputting of the output signal when the fault has been detected by the fault detection circuit.

5. The semiconductor device according to claim 4, wherein the output buffer brings the output into a high-impedance state when fault has been detected by the fault detection circuit.

6. The semiconductor device according to claim 4, wherein the output buffer fixes the output to a predetermined voltage value when fault has been detected by the fault detection circuit.

7. The semiconductor device according to claim 1, wherein the semiconductor chip further includes an output buffer which drives and outputs the output signal, and wherein the fault detection circuit compares the output signal obtained before being driven by the output buffer with the feedback signal which is supplied to the second pad.

8. The semiconductor device according to claim 1, wherein the fault detection circuit includes:
   a first AD converter which converts a voltage of the output signal into a first digital signal;
   a second AD converter which converts a voltage of the feedback signal into a second digital signal; and
   a decision circuit which decides whether a difference between a value that the first digital signal indicates and a value that the second digital signal indicates falls within a predetermined range.

9. The semiconductor device according to claim 1, wherein the fault detection circuit includes:
   a first AD converter which converts a voltage of the output signal into a first digital signal;
   a second AD converter which converts a voltage of the feedback signal into a second digital signal; and
   a decision circuit which decides whether a value that the first digital signal indicates and a value that the second digital signal indicates match each other.

10. A semiconductor system comprising:
    the semiconductor device according to claim 1, and
    an inverter which drives a motor on the basis of the output signal from the semiconductor device.

11. A vehicle comprising:
    an electronic control system configured to control a motor of the vehicle, the control system comprising:
       a semiconductor chip;
       a lead frame; and
       first and second bonding wires which couple together the lead frame and the semiconductor chip;
    an inverter which drives the motor of the vehicle on the basis of an output signal from the the electronic control system; and
    a coupling device configured to couple the electronic control system with the inverter,
    wherein the semiconductor chip includes:
       a first pad which is coupled to the first bonding wire and to which the output signal which has been generated in the semiconductor chip is supplied;
       a second pad which is coupled to the second bonding wire and to which a feedback signal is supplied from the lead frame, the feedback signal being the output signal that propagated through the first bonding wire to the lead frame and is fed back to the second pad by propagating through the second bonding wire; and
       a fault detection circuit configured to detect a fault in the first bonding wire based on a result obtained by comparing the output signal with the feedback signal.

* * * * *